(12) United States Patent
Wirz et al.

(10) Patent No.: US 9,966,347 B2
(45) Date of Patent: May 8, 2018

(54) UNDER-BUMP METAL STRUCTURES FOR INTERCONNECTING SEMICONDUCTOR DIES OR PACKAGES AND ASSOCIATED SYSTEMS AND METHODS

(71) Applicant: Micron Technology, Inc., Boise, ID (US)

(72) Inventors: Brandon P. Wirz, Kuna, ID (US); Jaspreet S. Gandhi, Boise, ID (US); Christopher J. Gambee, Caldwell, ID (US); Satish Yeldandi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/624,493

(22) Filed: Jun. 15, 2017

(65) Prior Publication Data
US 2017/0287857 A1  Oct. 5, 2017

Related U.S. Application Data

(62) Division of application No. 14/084,037, filed on Nov. 19, 2013, now Pat. No. 9,704,781.

(51) Int. Cl.
*H01L 21/20* (2006.01)
*H01L 21/768* (2006.01)
(Continued)

(52) U.S. Cl.
CPC ............ *H01L 24/03* (2013.01); *H01L 23/481* (2013.01); *H01L 24/05* (2013.01); *H01L 24/94* (2013.01); *H01L 2224/0347* (2013.01); *H01L 2224/03464* (2013.01); *H01L 2224/03614* (2013.01); *H01L 2224/03914* (2013.01); *H01L 2224/0401* (2013.01); *H01L 2224/05009* (2013.01); *H01L 2224/05017* (2013.01);
(Continued)

(58) Field of Classification Search
CPC ....... H01L 27/101; H01L 45/00; H01L 45/16; H01L 27/2409; H01L 27/2418; H01L 21/768
See application file for complete search history.

(56) References Cited

U.S. PATENT DOCUMENTS 6,489,229 B1  12/2002  Sheridan
7,800,238 B2   9/2010  Pratt
(Continued)

*Primary Examiner* — Kimberly Rizkallah
*Assistant Examiner* — Brian Turner
(74) *Attorney, Agent, or Firm* — Perkins Coie LLP

(57) ABSTRACT

The present technology is directed to manufacturing semiconductor dies with under-bump metal (UBM) structures for die-to-die and/or package-to-package interconnects or other types of interconnects. In one embodiment, a method for forming under-bump metal (UBM) structures on a semiconductor die comprises constructing a UBM pillar by plating a first material onto first areas of a seed structure and depositing a second material over the first material. The first material has first electrical potential and the second material has a second electrical potential greater than the first electrical potential. The method further comprises reducing the difference in the electrical potential between the first material and the second material, and then removing second areas of the seed structure between the UBM pillars thereby forming UBM structures on the semiconductor die.

21 Claims, 10 Drawing Sheets

(51) Int. Cl.
  *H01L 29/43* (2006.01)
  *H01L 29/84* (2006.01)
  *H01L 23/498* (2006.01)
  *H01L 23/00* (2006.01)
  *H01L 23/48* (2006.01)

(52) U.S. Cl.
  CPC ............... *H01L 2224/05083* (2013.01); *H01L 2224/05147* (2013.01); *H01L 2224/05155* (2013.01); *H01L 2224/05164* (2013.01); *H01L 2224/05166* (2013.01); *H01L 2224/05181* (2013.01); *H01L 2224/05187* (2013.01)

(56) References Cited

U.S. PATENT DOCUMENTS

| | | |
|---|---|---|
| 8,129,839 B2 | 3/2012 | Farnworth |
| 2008/0303968 A1 | 12/2008 | Terada et al. |
| 2009/0163019 A1* | 6/2009 | Srivastava ............... H01L 24/13 438/612 |
| 2011/0101527 A1 | 5/2011 | Cheng et al. |
| 2012/0091577 A1 | 4/2012 | Hwang et al. |
| 2013/0012014 A1 | 1/2013 | Lei et al. |
| 2013/0171799 A1* | 7/2013 | Miyanaga ............... H01L 27/101 438/382 |
| 2015/0084207 A1 | 3/2015 | Chauhan et al. |
| 2015/0137353 A1 | 5/2015 | Gandhi et al. |

* cited by examiner

UNDER-BUMP METAL STRUCTURES FOR INTERCONNECTING SEMICONDUCTOR DIES OR PACKAGES AND ASSOCIATED SYSTEMS AND METHODS

CROSS-REFERENCE TO RELATED APPLICATION

This application is a divisional of U.S. application Ser. No. 14/084,037 filed Nov. 19, 2013, which is incorporated herein by reference in its entirety.

TECHNICAL FIELD

The present technology is directed generally to manufacturing semiconductor devices, and in several embodiments more particularly to under-bump metal (UBM) structures for die-to-die and/or package-to-package interconnects.

BACKGROUND

Microelectronic devices, such as memory devices, microprocessors, and light emitting diodes, typically include one or more semiconductor dies mounted to a substrate and encased in a plastic protective covering. Semiconductor die include functional features, such as memory cells, processor circuits, and interconnecting circuitry. Semiconductor die also typically include bond pads electrically coupled to the functional features. The bond pads are electrically connected to pins or other types of terminals that extend outside the protective covering for connecting the semiconductor die to busses, circuits, or other assemblies.

Semiconductor die manufacturers are under increasing pressure to reduce the volume occupied by the die and yet increase the capacity and/or speed of the resulting encapsulated assemblies. To meet these demands, semiconductor die manufacturers often stack multiple die on top of each other to increase the capacity or performance of the device within the limited volume on the circuit board or other element to which the dies are mounted.

The stacked semiconductor die are typically electrically connected by solder bumps or other electrical connectors that are attached to UBM structures. The UBM structures are typically formed by depositing a copper seed structure onto a wafer, forming a mask on the copper seed structure having openings aligned with bond pads on the die, plating copper onto the seed structure, and then plating one or more other materials over the copper to form UBM pillars. The topmost material of the UBM pillars is typically selected to promote wetting for subsequently forming interconnects on the top-most material. After forming the UBM pillars, the mask is removed and the exposed portions of the seed structure are removed using a suitable wet etch to form isolated UBM structures. For example, it is often desirable to form a top-most layer of palladium or gold, and then perform a wet etch that removes the remaining portion of the copper seed structure to electrically isolate the UBM structures. However, the chemistry for wet etching the copper seed structure can significantly undercut the copper to the extent that it impairs the mechanical stability of the UBM structures and the electrical connection between the UBM structures and the underlying metal interconnects (e.g., through-substrate vias (TSVs) or other interconnects). Accordingly, there is a need for innovation and improvement in UBM structures and the methods for manufacturing these features.

BRIEF DESCRIPTION OF THE DRAWINGS

Many aspects of the present technology can be better understood with reference to the following drawings. The components in the drawings are not necessarily to scale, but instead emphasis is placed on clearly illustrating the principles of the present technology.

FIGS. 2-9 are cross-sectional views schematically illustrating a portion of a semiconductor die at various stages of a method in accordance with an embodiment of the present technology, and in particular

DETAILED DESCRIPTION

Figure 1:
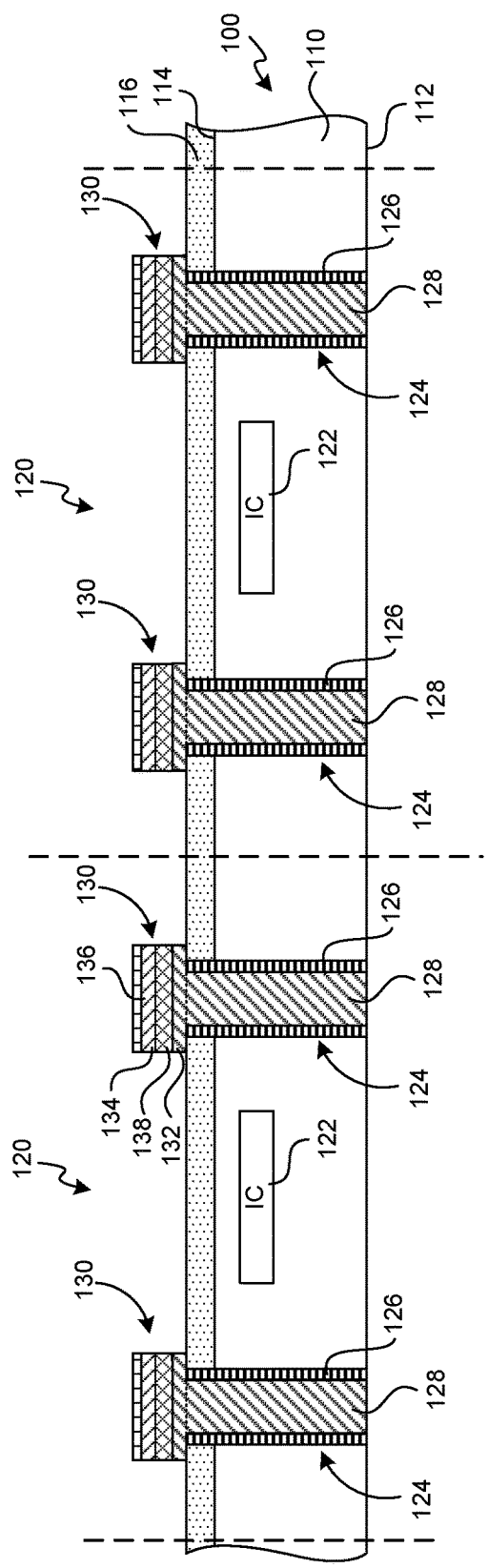
FIG. 1 is a cross-sectional view of a substrate assembly schematically showing a plurality of semiconductor die in accordance with an embodiment of the present technology.

Specific details of several embodiments of methods for making semiconductor devices are described herein along with related devices and systems. The term "semiconductor device" generally refers to a solid-state device that includes one or more semiconductor materials. Examples of semiconductor devices include logic devices, memory devices, microprocessors, and diodes among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of UBM structures that are electrically coupled to TSVs, such as through-silicon vias that have electrically conductive plugs or connectors which extend completely through the substrate and/or packaging material when completed. A person having ordinary skill in the relevant art will also understand that the present technology may have embodiments for forming UBM structures on either the first side or the second side of a substrate assembly, and the UBM structures may be used in the context of other electrical connectors associated with a semiconductor assembly. The present technology may accordingly be practiced without several of the details of the embodiments described herein with reference to FIGS. 1-13.

For ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

Several embodiments of the present technology significantly reduce the undercut of a first material (e.g., copper) of a UBM structure that occurs while removing a seed structure that was used to plate the first material onto the substrate assembly. In the formation of a UBM structure in which the first material is copper or nickel and a second material over the first material is palladium, the copper or nickel can be significantly undercut while wet etching the seed structure to electrically isolate the UBM structures from each other. For example, the average undercut of copper can be approximately 5 µm and as much as 14 µm using conventional processes. Without being limited to any particular theory, it is believed that the underlying copper in UBM structures is susceptible to corrosion, for example galvanic corrosion, in the presence of a wet etch solution when they are covered by palladium or another highly noble material. Several embodiments of the present technology reduce the undercut of the first material or base material of a UBM structure by reducing the difference in electrical potential between the copper and/or nickel and a more noble overlying material as explained in more detail below.

FIG. 1 is a cross-sectional view that schematically illustrates a substrate assembly 100 having a semiconductor material 110 with a first side 112 and a second side 114. The substrate assembly 100 further includes a dielectric material 116 on the second side 114 of the semiconductor material 110. A plurality of semiconductor die 120 are formed at discrete areas of the substrate assembly 100. Although two semiconductor die 120 are illustrated in FIG. 1, in practice the semiconductor assembly 100 typically has several hundred or even over 1,000 individual semiconductor die. The individual semiconductor die 120 can include integrated circuitry 122 and a plurality of interconnects 124 electrically coupled to the integrated circuitry 122. In the embodiment shown in FIG. 1, the interconnects 124 are TSVs that include a dielectric liner 126 and a conductive plug 128 within the dielectric liner 126. The interconnects 124 can accordingly extend completely through the substrate assembly 100.

The semiconductor die 120 further include a plurality of UBM structures 130, and individual UBM structures 130 are electrically coupled to corresponding interconnects 124. In several embodiments, the individual UBM structures 130 comprise a first material 132 electrically coupled to one of the interconnects 124, a second material 134 over the first material 132, and a suppressant material 136 on the second material 134. The first material 132 has a first electrical potential, and the second material 134 has a second electrical potential greater than the first electrical potential. By forming the suppressant material 136 on the second material 134, the suppressant material 136 accordingly reduces the difference between the electrical potentials of the first and second materials 132 and 134, which in turn reduces galvanic corrosion of the first material 132 in the presence of an electrolyte.

In the embodiment illustrated in FIG. 1, the UBM structures 130 can further include an optional intermediate material 138 between the first material 132 and the second material 134. For example, in a particular embodiment, the first material 132 can comprise copper, the second material 134 can comprise palladium, the suppressant material 136 can comprise an oxide formed on the palladium second material 134, and the intermediate material 138 can comprise nickel. This embodiment forms a Cu/Ni/Pd UBM structure 130. In another embodiment, the first material 132 can comprise nickel, the second material 134 can comprise palladium, and the suppressant material 136 can comprise an oxide. This embodiment comprises a Ni/Pd UBM structure 130. Further embodiments and aspects of forming UBM structures in accordance with the present technology, such as the UBM structure 130 shown in FIG. 1, are described below with reference to FIGS. 2-9.

Figure 2:
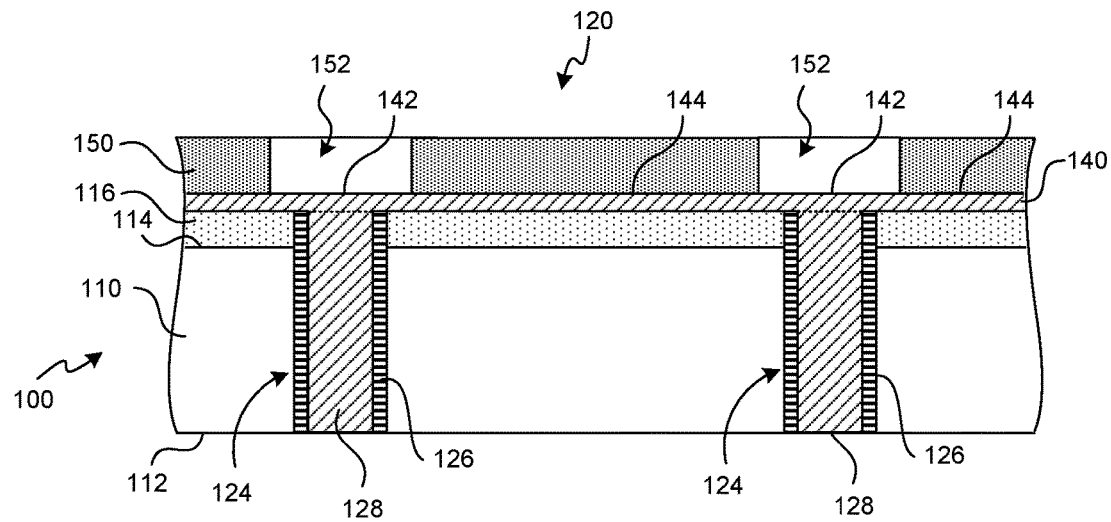

FIG. 2 is a cross-sectional view schematically illustrating a semiconductor die 120 at a portion of the substrate assembly 100. More specifically, FIG. 2 illustrates the semiconductor die 120 after a seed structure 140 has been formed on the dielectric material 116 and the portions of the interconnects 124 proximate to the second side 114 of the substrate 110, and a mask 150 has been formed on the seed structure 140. The seed structure 140 can be a single material suitable for plating the base or first material of a UBM structure. In several embodiments, the seed structure 140 includes a barrier material and a seed material on the barrier material. The barrier material can be tantalum, tantalum nitride, titanium, titanium-tungsten or another material that prevents diffusion of the UBM materials into the dielectric material 116 and the substrate 102. The seed material can be copper, a copper alloy, nickel, or other suitable materials for plating the first material 132 (FIG. 1) onto the seed material using electro-plating or electroless-plating techniques known in the art. In practice the seed structure 140 can integrate with the conductive plug 128 of the interconnect 124.

The seed structure 140 can have first areas 142 associated with the location of the interconnects 124 and second areas 144 between the first areas 142. The mask 150 can be a resist material or other suitable mask material having a plurality of openings 152 aligned with the first areas 142 of the seed structure 140. As explained in more detail below, UBM pillars are formed in the openings 152 of the mask 150.

Figure 3:
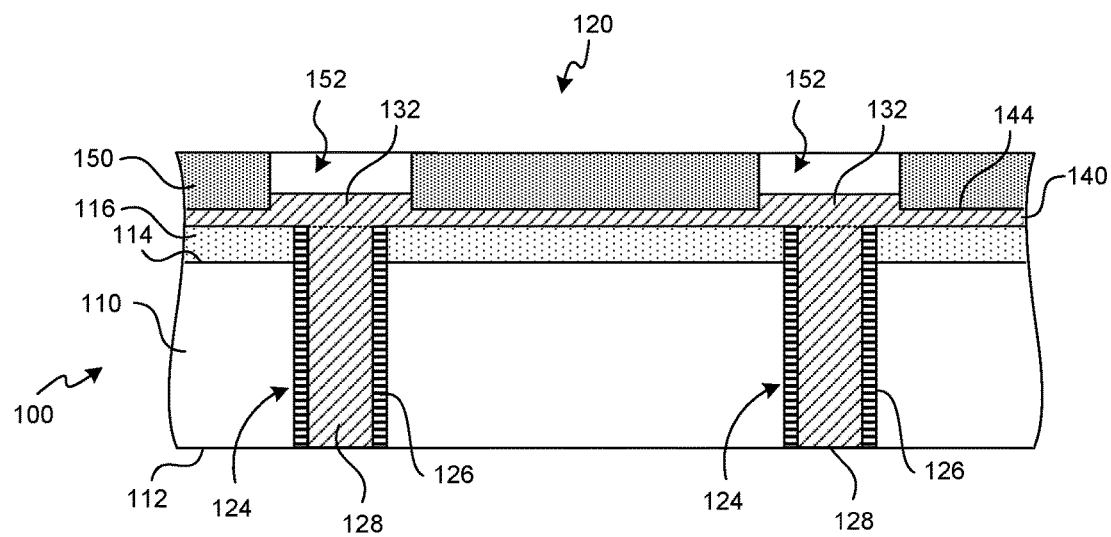

FIG. 3 is a cross-sectional view schematically illustrating the semiconductor die 120 after the first material 132 has been formed on the exposed first area 142 (FIG. 2) of the seed structure 140. In one embodiment, the seed structure 140 includes a copper seed material deposited using a physical vapor deposition process, and the first material 132 comprises copper deposited onto the copper seed material using an electro-plating or electroless-plating process known in the art. The first material 132 can accordingly define a base material of the UBM structure. In one embodiment, the first material 132 has a first diameter (e.g., 30 µm) at this stage of the process, but the diameter of the first material 132 can have any other suitable dimension according to the specific configuration of the particular semiconductor die 120.

Figure 4:
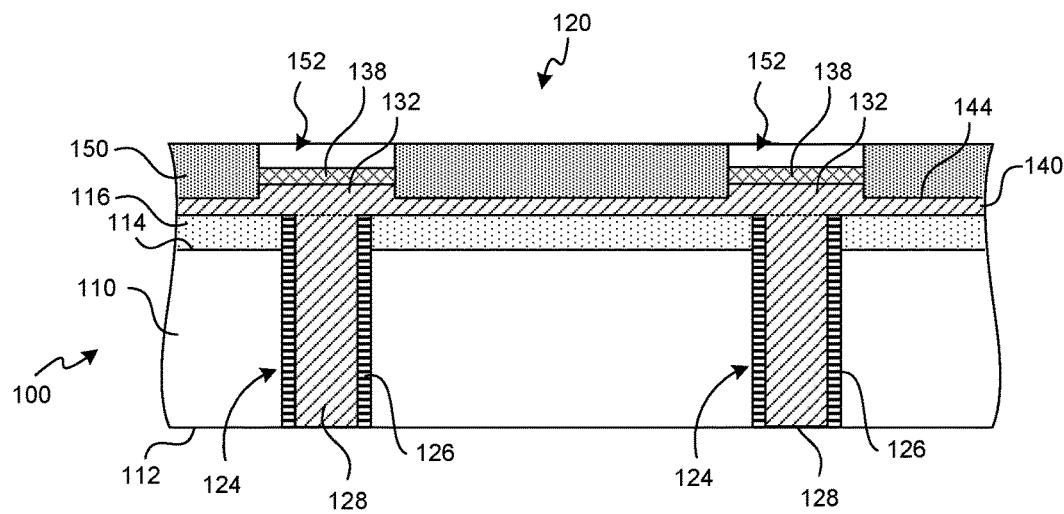

FIG. 4 is a cross-sectional view schematically illustrating the semiconductor die 120 after the optional intermediate material 138 has been deposited within the openings 152 of the mask 150 and onto the first material 132. The intermediate material 138 can be plated onto the first material 132, or in other embodiments the intermediate material 138 can be deposited using vapor deposition processes or other deposition techniques. When the first material 132 comprises copper, the intermediate material 138 can comprise nickel or other suitable materials for adhering to the copper first material 132 and providing a good surface for subsequent deposition of the second material 134 (FIG. 1) onto the intermediate material 138.

Figure 5:
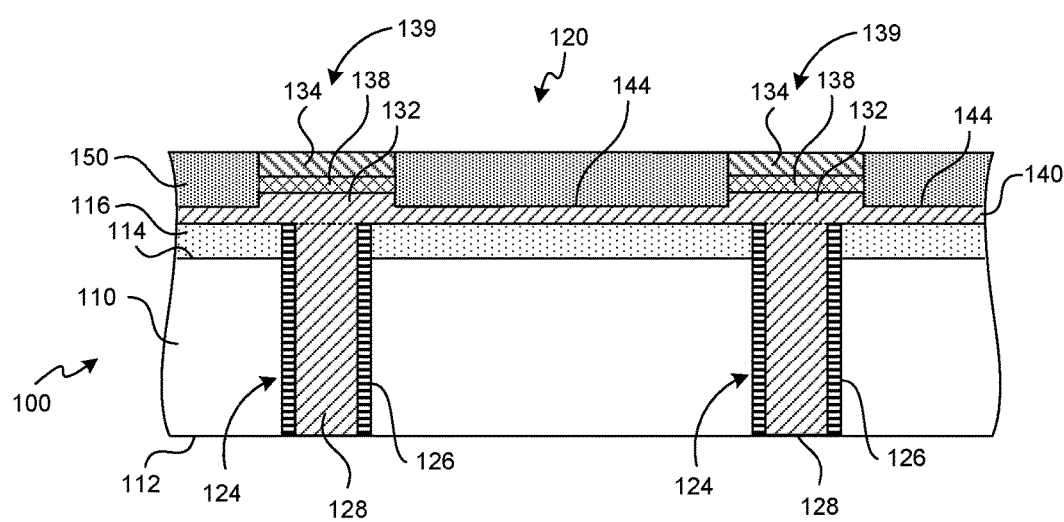

FIG. 5 is a cross-sectional view schematically illustrating the semiconductor die 120 after the second material 134 has been deposited into the openings 152 such that the second material 134 is over the first material 132. In the embodiment illustrated in FIG. 5, the second material 134 is deposited onto the intermediate material 138 such that the second material 134 is also over the intermediate material 138. In other embodiments, the intermediate material 138 is eliminated such that the second material 134 is deposited directly onto the first material 132. The second material 134 can comprise palladium or other suitable materials that provide a good wetting surface for forming interconnects on the second material 134 (e.g., highly noble materials). The first material 132, second material 134 and optional intermediate material 138 can define a UBM pillar 139. At this stage of the process, the semiconductor die 120 has a plurality of UBM pillars 139 that are electrically coupled to each other through the seed structure 140.

Figure 6A:
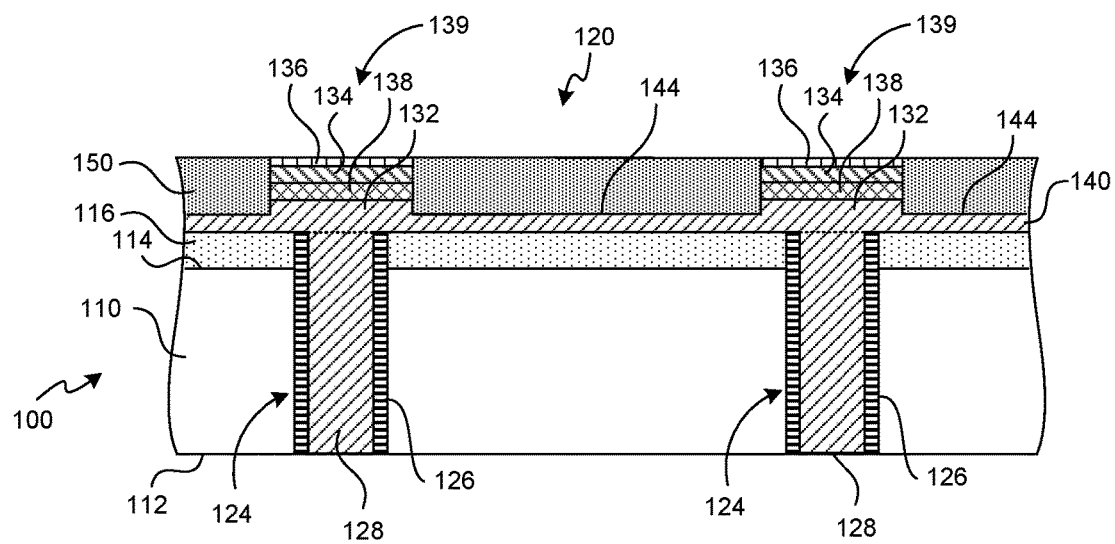
FIGS. 6A and 6B show alternative embodiments of one of the stages.

FIG. 6A is a cross-sectional view schematically illustrating the semiconductor die 120 after the suppressant material 136 has been formed in accordance with one embodiment of the technology. The suppressant material 136 can be a passivation material formed on the second material 134. When the suppressant material 136 is formed by oxidizing the upper portion of the second material 134 shown in FIG. 5, the remaining second material 134 shown in FIG. 6 is unoxidized second material and the suppressant 136 is an oxide of the second material 134. In another embodiment, an upper portion of the second material 134 shown in FIG. 5 can be removed (e.g., selectively etched) to form a recess, and the suppressant material 136 can be deposited or grown in the recess. In either case, the suppressant material 136 is formed on the second material 134 (e.g., the remaining or recessed portion of the second material 134). The suppressant material 136 reduces the difference in electric potential between the first and second materials 132 and 134 compared to the state of the second material 134 before the suppressant material 136 was formed. The suppressant material 136 can be an oxide formed using an $O_2$ ash process. In one specific embodiment, the substrate assembly 100 is placed in an atmosphere containing argon (e.g., Ar 20 at sccm), nitrogen (e.g., $N_2$ at 40 sccm), and oxygen (e.g., $O_2$ at 500 sccm) under a pressure of 12 mT. The substrate assembly 100 is placed on a chuck having a chuck temperature of 40° C. while RF power is provided at appropriate duty cycles (e.g., 400 W RF power). For example, the substrate assembly 100 can be placed in the $Ar/N_2/O_2$ atmosphere for approximately 15 seconds and then the RF power can be applied for approximately 20 seconds.

Figure 6B:
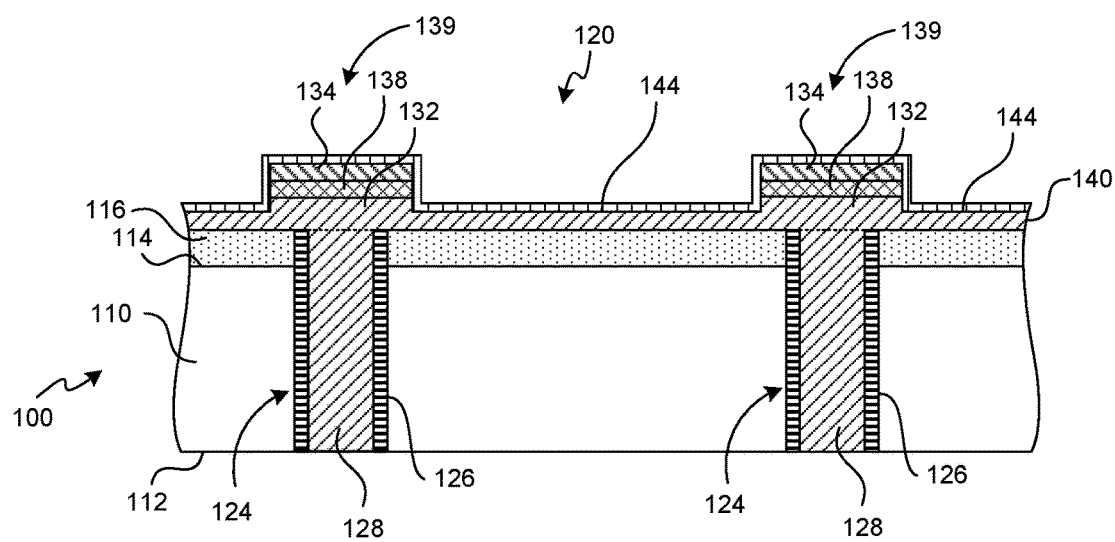

FIG. 6B is a cross-section view schematically illustrating the semiconductor die 120 after a suppressant material 136a has been formed in accordance with an alternative embodiment of the technology. The embodiment shown in FIG. 6B is similar to the embodiment shown in FIG. 6A, however in FIG. 6B the mask 150 is removed before forming the suppressant material 136a. As such, the suppressant material 136a can be a conformal material formed by depositing or growing a material over the seed structure 140 and the pillars 139. In one specific example, the suppressant material 136a can be an oxide formed using an $O_2$ ash process, such as the process described above with respect to FIG. 6A.

Figure 7:
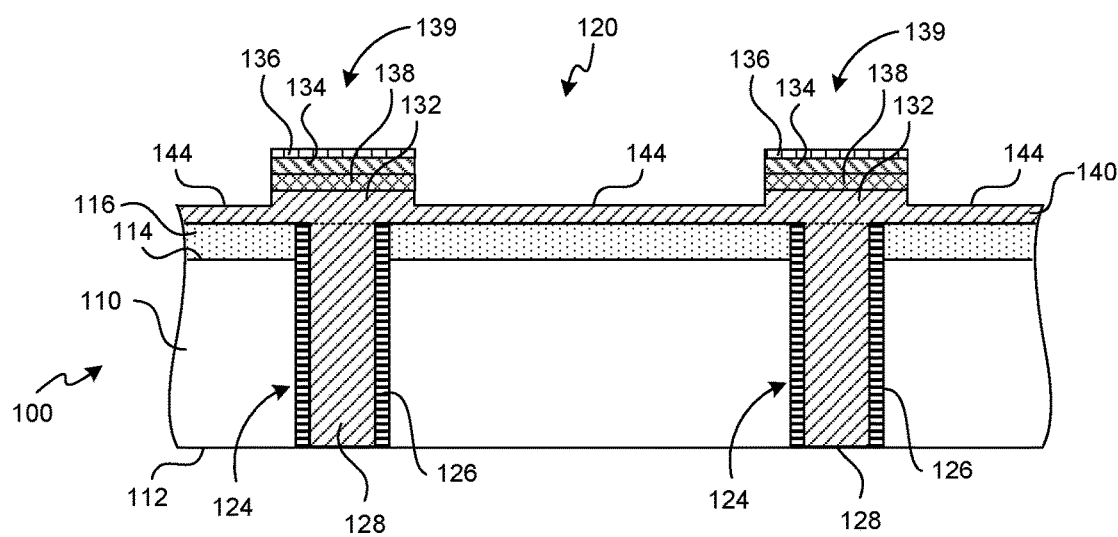
Figure 8:
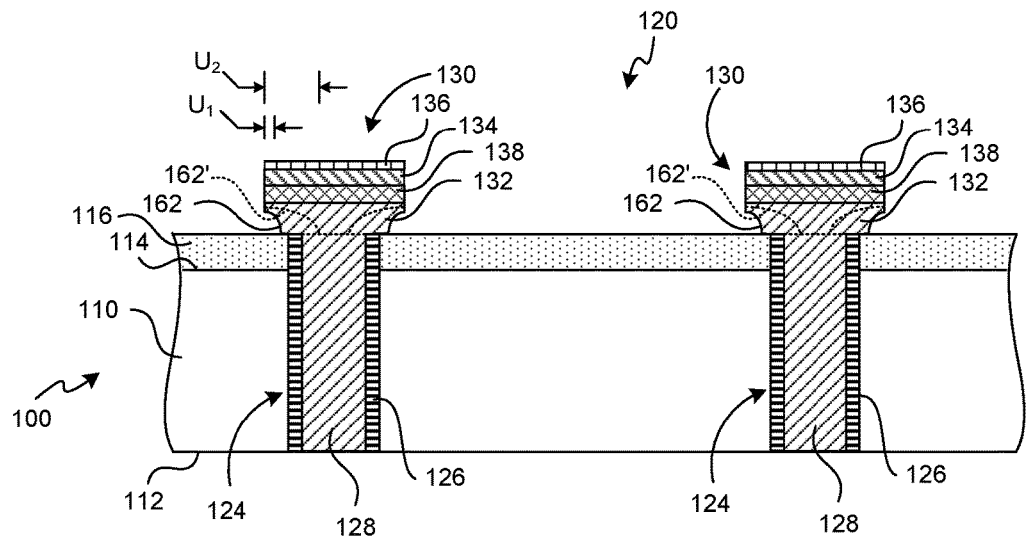

FIGS. 7 and 8 are cross-sectional views that schematically illustrate embodiments of the present technology in which the seed structure 140 is removed to electrically isolate the UBM pillars 139 and form electrically isolated UBM structures 130 (FIG. 8). FIG. 7 shows the semiconductor die 120 after the mask 150 has been removed to expose the second areas 144 of the seed structure 140 between the UBM pillars 139. FIG. 8 shows the semiconductor die 120 after the second areas 144 (FIG. 7) of the seed structure 140 (FIG. 7) have been removed to electrically isolate the UBM pillars 139 (FIG. 7) and thereby form individual UBM structures 130 at corresponding interconnects 124. The second areas 144 of the seed structure 140 can be removed using a wet etch suitable for removing the materials of the seed structure.

Referring still to FIG. 8, the wet etch process forms an undercut 162 in the first material 132. In the UBM structures 130 of the present technology, the presence of the suppressant material 136 likely reduces the difference in the electrical potential (e.g., galvanic nobility) between the first material 132 and the second material 134, which may reduce the galvanic corrosion of the first material 132 during the wet etch process. This in turn can decrease the extent of the undercut 162 compared to conventional processes and UBM structures without the suppressant material 136. For example, the depth $U_1$ of the undercut 162 in the UBM structure 130 formed in accordance with the present technology is much less than the depth $U_2$ of the severe type of undercutting 162' (shown in dotted line) that can occur with conventional UBM structures without the suppressant material.

Figure 9:
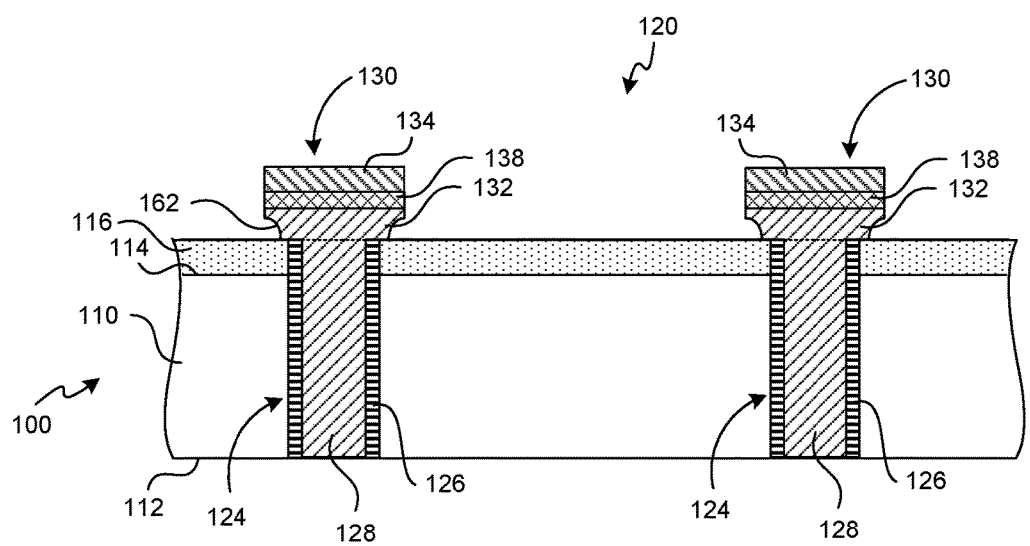

FIG. 9 is a cross-sectional view schematically illustrating the semiconductor die 120 after the suppressant material 136 has been removed to provide a finished UBM structure 130 in accordance with an embodiment of the present technology. It will be appreciated that in some embodiments the suppressant material 136 shown in FIG. 8 can remain on the second material 134 depending on the conductivity of the suppressant material 136.

Figure 10:
FIG. 10 is a graph illustrating the average undercut into a copper layer using conventional technology compared to the undercut of the copper using methods and structures in accordance with an embodiment of the present technology.

Several embodiments of the UBM structure 130 and the processes for forming the UBM structure 130 described above with reference to FIGS. 1-9 significantly reduce the undercut caused by removing the seed structure as shown in FIG. 8. FIG. 10 is a graph comparing the undercut of UBM structures having a diameter of 30 μm and a film stack including a first material comprising copper, an intermediate material comprising nickel, and a second material comprising palladium. The UBM structures formed without the suppressant material in accordance with conventional technologies had an average undercut of approximately 5 μm across a wide distribution from approximately 2 μm to approximately 9.5 μm. In contrast, the UBM structures formed with a galvanic suppressant in accordance with several embodiments of the present technology had an average undercut under 2 μm within a much tighter distribution between slightly less than 1 μm to slightly more than 2 μm. The depth of the undercut in embodiments of UBM structures in accordance with the present technology is less than 50% of the depth of the undercut in UBM structures of the same size without the suppressant material. Additionally, the depth of the average undercuts in UBM structures in accordance with embodiments of the present technology are less than 20% of the cross-sectional dimension of the UBM pillar, or in other embodiments less than 10% of the cross-sectional dimension of the UBM pillars. As a result, the experimental studies show that semiconductor dies with UBM structures formed in accordance with several embodiments of the present technology have better mechanical integrity and electrical performance compared to UBM structures formed in accordance with conventional technologies. Several embodiments of UBM structures formed in accordance with the present technology may accordingly reduce pin leakage failures, prevent UBM consumption due to solder wrap around, and other problems associated with undercutting of the UBM structures.

Figure 11:
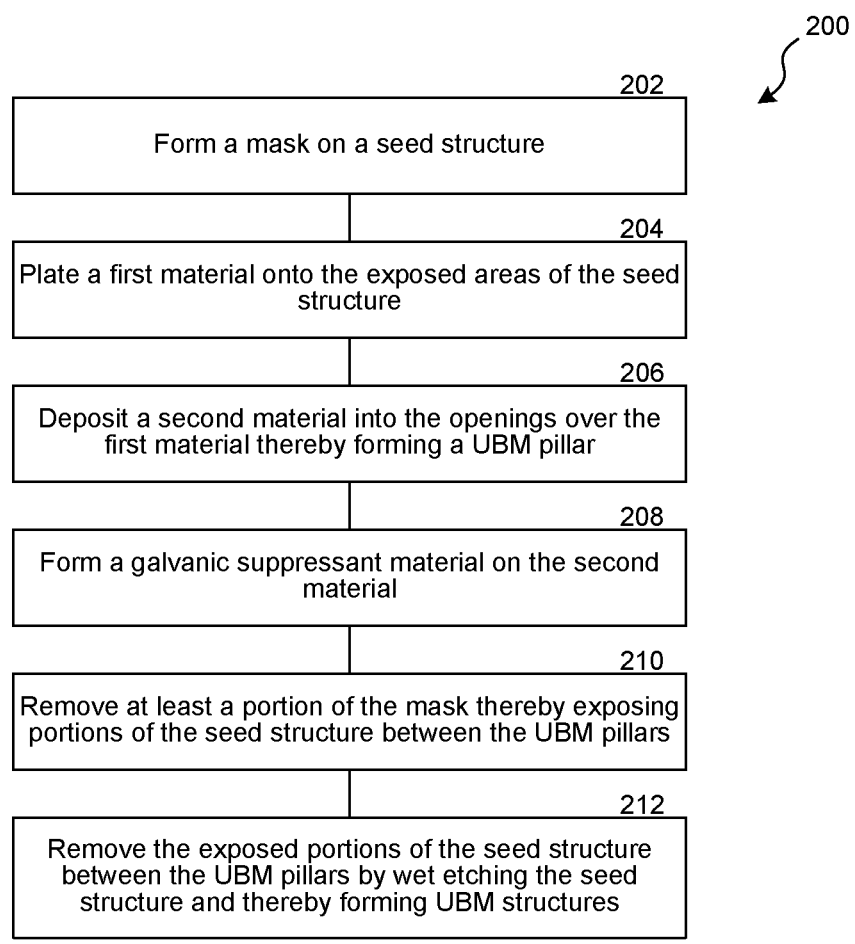
FIG. 11 is a flow chart of a method in accordance with an embodiment of the present technology.

FIG. 11 is a flow chart of an embodiment of a method 200 for forming UBM structures on a semiconductor die in accordance with an embodiment of the present technology. In this embodiment, the method 200 includes forming a mask on a seed structure (block 202) and plating a first material onto the exposed areas of the seed structure (block 204). The mask, for example, has openings that expose areas of the seed structure which are electrically coupled to interconnects that extend at least partially through a semiconductor substrate. In several embodiments, the openings of the mask are superimposed over TSVs. The method 200 further includes depositing a second material into the openings over the first material thereby forming a UBM pillar (block 206). The second material is different than the first material, and the second material has a higher galvanic nobility than the first material. The method 200 further includes forming a suppressant material on the second material (block 208) and removing at least a portion of the mask and thereby exposing portions of the seed structure between the UBM pillars (block 210). The method 200 continues by removing the exposed portions of the seed structure between the UBM pillars by wet etching the seed structure and thereby forming UBM structures on the semiconductor die (block 212). As the seed structure is wet etched, the galvanic suppressant inhibits corrosion of the first material caused by the difference in galvanic nobility between the second and first materials.

Figure 12:
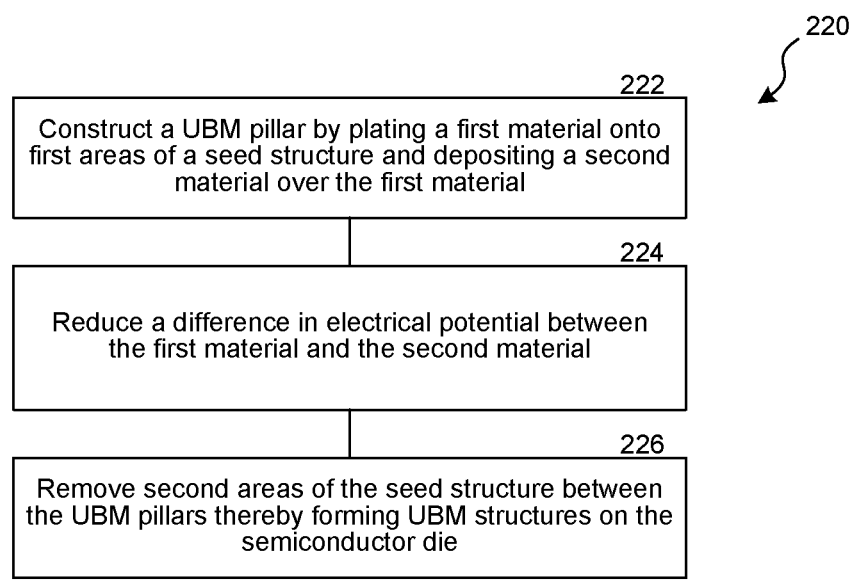
FIG. 12 is a flowchart of a method in accordance with an embodiment of the present technology.

FIG. 12 is a flow chart of a method 220 for forming UBM structures on a semiconductor die in accordance with an embodiment of the present technology. The method 220 can include constructing a UBM pillar by plating a first material onto first areas of a seed structure and depositing a second material over the first material (block 222). The first material has first electrical potential and the second material has a second electrical potential greater than the first electrical potential. The method 220 further includes reducing a difference in electrical potential between the first material and the second material (block 224). The method 220 continues by removing second areas of the seed structure between the UBM pillars and thereby forming UBM structures on the semiconductor die (block 226).

Figure 13:
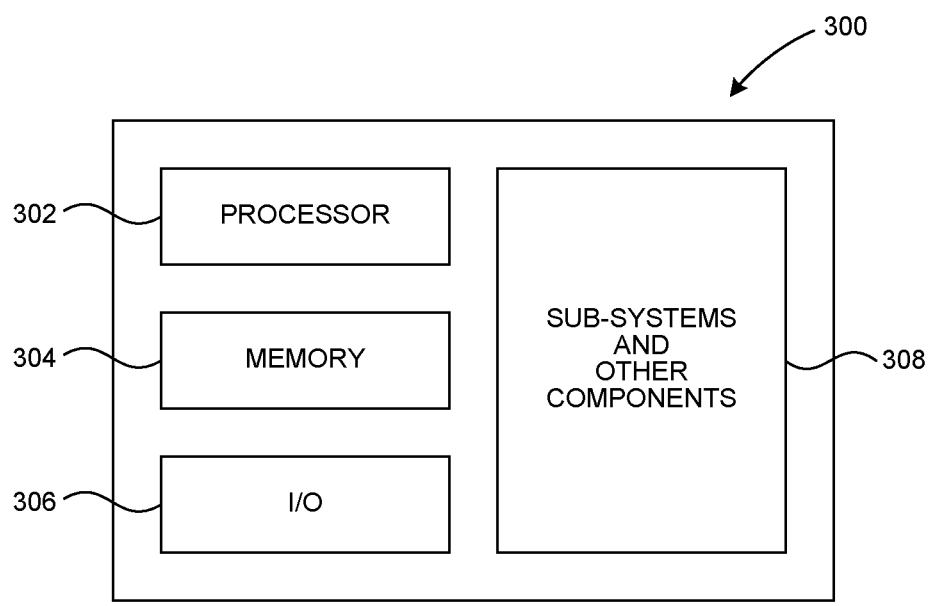
FIG. 13 is a block diagram illustrating a system that incorporates a semiconductor device in accordance with an embodiment of the present technology.

Any one of the semiconductor devices having the features described above with reference to FIGS. 1-12 can be incorporated into any of a myriad of larger and/or more complex systems, a representative example of which is system 300 shown schematically in FIG. 13. The system 300 can include a processor 302, a memory 304 (e.g., SRAM, DRAM, flash, and/or other memory devices), input/output devices 306, and/or other subsystems or components 308. The semiconductor device 100 described above with reference to FIGS. 1-12 can be included in any of the elements shown in FIG. 13. The resulting system 300 can be configured to perform any of a wide variety of suitable computing, processing, storage, sensing, imaging, and/or other functions. Accordingly, representative examples of the system 300 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 300 include lights, cameras, vehicles, etc. With regard to these and other example, the system 300 can be housed in a single unit or distributed over multiple interconnected units, e.g., through a communication network. The components of the system 300 can accordingly include local and/or remote memory storage devices and any of a wide variety of suitable computer-readable media.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method for forming under-bump metal (UBM) structures on a semiconductor die, comprising:
   forming a mask on a seed structure, wherein the mask has openings that expose areas of the seed structure that are electrically coupled to interconnects that extend at least partially through a semiconductor substrate;
   plating a first material onto the exposed areas of the seed structure;
   depositing a second material into the openings over the first material thereby forming a UBM pillar, wherein the second material is different than the first material, and the second material has a higher galvanic nobility than the first material;
   forming a suppressant material on the second material;
   removing at least a portion of the mask thereby exposing portions of the seed structure between the UBM pillars; and
   removing the exposed portions of the seed structure between the UBM pillars by wet etching the seed structure and thereby forming UBM structures on the semiconductor die, wherein the galvanic suppressant inhibits corrosion of the first material caused by the difference in galvanic nobility between the second and first materials.

2. The method of claim 1 wherein:
   the seed structure comprise at least copper;
   plating the first material comprises plating copper onto the seed structure;
   depositing the second material comprises depositing palladium into the openings; and
   forming the suppressant material on the second material comprises forming a galvanic passivation material on the palladium that reduces the electrical potential of the palladium compared to without the galvanic passivation material.

3. The method of claim 2 wherein forming a galvanic passivation material comprises oxidizing the surface of the palladium using an $O_2$ ash process in an atmosphere including argon, nitrogen and oxygen at a pressure of 12 mT and a chuck temperature of 40° C.

4. The method of claim 1 wherein forming the suppressant material reduces an atomic percentage of palladium and increases an atomic percentage of oxide at an outer surface of the UBM structure.

5. The method of claim 1, further comprising depositing an intermediate material onto the first material before depositing the second material into the openings, and subsequently depositing the second material onto the intermediate material.

6. The method of claim 5 wherein the first material comprises copper, the intermediate material comprises nickel, and the second material comprises palladium.

7. A method for forming under-bump metal (UBM) structures on a semiconductor die, comprising:
constructing a UBM pillar by plating a first material onto first areas of a seed structure and depositing a second material over the first material, wherein the first material has first electrical potential and the second material has a second electrical potential greater than the first electrical potential;
reducing a difference in electrical potential between a surface of the second material and the first material; and
removing second areas of the seed structure between the UBM pillars thereby forming UBM structures on the semiconductor die.

8. The method of claim 7 wherein:
the seed structure comprise at least copper;
plating the first material comprises plating copper onto the seed structure;
depositing the second material comprises depositing palladium into the openings; and
reducing the difference in electrical potential comprises forming a suppressant material on the second material.

9. The method of claim 8 wherein forming a suppressant material comprises forming a galvanic passivation material on the palladium that passivates a surface of the palladium.

10. The method of claim 9 wherein forming a galvanic passivation material comprises oxidizing the surface of the palladium using an $O_2$ ash process in an atmosphere including argon, nitrogen and oxygen at a pressure of 12 mT and a chuck temperature of 40° C.

11. The method of claim 7 wherein reducing the difference in electrical potential comprises forming a suppressant material that reduces an atomic percentage of palladium and increases an atomic percentage of oxide at an outer surface of the UBM structure.

12. The method of claim 7, further comprising depositing an intermediate material onto the first material before depositing the second material into the openings, and subsequently depositing the second material onto the intermediate material such that the UBM pillar has a copper/nickel/palladium structure.

13. The method of claim 12 wherein the first material comprises copper, the intermediate material comprises nickel, and the second material comprises palladium such that the UBM pillar has a nickel/palladium structure.

14. The method of claim 7 wherein the first material comprises nickel and the second material comprises palladium, and wherein the palladium is deposited directly on the nickel.

15. The method of claim 7 wherein removing second areas of the seed structure between the UBM pillars comprises performing a wet etch that undercuts the first material of the UBM pillar.

16. The method of claim 15 wherein the undercut has a depth that is less than 50% of a depth of another undercut of the first material without reducing the difference in electrical potential.

17. The method of claim 7 wherein:
the seed structure comprises a copper seed material, the first material comprises copper, and the second material comprises palladium;
the UBM structure has a cross-sectional dimension;
removing the second areas of the seed structure between the UBM pillars comprises performing a wet etch that removes the copper seed material between the UBM pillars and undercuts the copper first material; and
the undercut of the copper first material had a depth less than approximately 10% of the cross-sectional dimension of the UBM pillar.

18. The method of claim 7 wherein:
the seed structure comprises a copper seed material, the first material comprises copper, and the second material comprises palladium;
the UBM structure has a cross-sectional dimension;
removing the second areas of the seed structure between the UBM pillars comprises performing a wet etch that removes the copper seed material between the UBM pillars and undercuts the copper first material; and
the undercut of the copper first material had a depth less than approximately 20% of the cross-sectional dimension of the UBM pillar.

19. A method of forming a structure on a semiconductor die, comprising:
forming a first material having a first electrical potential;
forming a second material having a second electrical potential, wherein the second material is electrically coupled to the first material;
forming a suppressor material on the surface of the second material thereby reducing a difference in electrical potential between the surface of the second material and the first material; and
exposing the first material to an electrolyte, wherein the suppressor material inhibits corrosion of the first material in the presence of the electrolyte.

20. The method of claim 19 wherein the first material comprises copper, the second material comprises palladium, and the suppressor material comprises an oxide of the palladium.

21. The method of claim 19 wherein the structure comprises an underbump metal structure formed on a through-substrate via.

* * * * *